United States Patent
Shen et al.

(10) Patent No.: US 10,320,422 B2
(45) Date of Patent: Jun. 11, 2019

(54) CHANNEL CODING METHOD AND DEVICE

(71) Applicant: Huawei Technologies Co., Ltd., Shenzhen (CN)

(72) Inventors: Hui Shen, Shenzhen (CN); Bin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 170 days.

(21) Appl. No.: 14/947,653

(22) Filed: Nov. 20, 2015

(65) Prior Publication Data
US 2016/0079999 A1  Mar. 17, 2016

Related U.S. Application Data

(63) Continuation of application No. PCT/CN2014/078741, filed on May 29, 2014.

(30) Foreign Application Priority Data

May 31, 2013 (CN) .......................... 2013 1 0213255

(51) Int. Cl.
*H04L 1/00* (2006.01)
*H03M 13/09* (2006.01)
(Continued)

(52) U.S. Cl.
CPC ....... *H03M 13/2792* (2013.01); *H03M 13/09* (2013.01); *H03M 13/13* (2013.01);
(Continued)

(58) Field of Classification Search
CPC ......... H03M 13/2792; H03M 13/2906; H03M 13/27; H03M 13/13; H03M 13/09;
(Continued)

(56) References Cited

U.S. PATENT DOCUMENTS 3,652,998 A * 3/1972 Forney, Jr. ................ G06F 7/76
                                                            377/64
6,081,919 A   6/2000 Fujiwara et al.
(Continued)

FOREIGN PATENT DOCUMENTS

CN        101277165 A      10/2008
CN        101636938 A       1/2010
(Continued)

OTHER PUBLICATIONS

H. AfŞ er, N. Tirpan, H. Delig and M. Koca, "Bit-interleaved polar-coded modulation," 2014 IEEE Wireless Communications and Networking Conference (WCNC), Istanbul, 2014, pp. 480-484.*

(Continued)

*Primary Examiner* — Cynthia Britt
(74) *Attorney, Agent, or Firm* — Fish & Richardson P.C.

(57) ABSTRACT

The present invention provides a coding method and a coding device. The coding method includes: coding information bits a to be coded via cyclic redundancy check CRC, then inputting the bits coded via the CRC into an interleaver determined by a construction parameter of a Polar code, where the interleaver is configured to interleave the bits coded via the CRC and output interleaved bits; and coding the output interleaved bits via the Polar code to obtain a coded Polar code. The above method is used to solve a problem in the prior art that minimum code distance of a Polar code is not large enough when the Polar code is relatively short or is of a medium length.

8 Claims, 2 Drawing Sheets

---

Coding information bits to be coded via CRC, then inputting the bits coded via the CRC into an interleaver determined by a construction parameter of a Polar code, where the interleaver is configured to interleave the bits coded via the CRC and output interleaved bits — 101

Coding the output interleaved bits via the Polar code to obtain a coded Polar code — 102

(51) Int. Cl.
*H03M 13/27* (2006.01)
*H03M 13/13* (2006.01)
*H03M 13/29* (2006.01)

(52) U.S. Cl.
CPC ....... *H03M 13/27* (2013.01); *H03M 13/2906* (2013.01); *H04L 1/0041* (2013.01); *H04L 1/0057* (2013.01); *H04L 1/0061* (2013.01); *H04L 1/0071* (2013.01)

(58) Field of Classification Search
CPC ... H04L 1/0071; H04L 1/0065; H04L 1/0061; H04L 1/0057; H04L 1/0041
See application file for complete search history.

(56) References Cited

U.S. PATENT DOCUMENTS

| | | | | |
|---|---|---|---|---|
| 9,503,126 | B2 * | 11/2016 | Vardy | H03M 13/13 |
| 2013/0145239 | A1 | 6/2013 | Pi et al. | |
| 2013/0283116 | A1 * | 10/2013 | Arikan | H03M 13/13 714/752 |
| 2013/0336372 | A1 * | 12/2013 | Lee | H04B 7/0413 375/219 |
| 2013/0343271 | A1 * | 12/2013 | El-Khamy | H04L 1/004 370/328 |
| 2014/0072067 | A1 * | 3/2014 | Yu | H04B 7/0417 375/267 |
| 2014/0173376 | A1 * | 6/2014 | Jeong | H03M 13/2906 714/755 |
| 2014/0208183 | A1 * | 7/2014 | Mahdavifar | H03M 13/296 714/755 |
| 2016/0182187 | A1 * | 6/2016 | Kim | H03M 13/09 714/807 |
| 2016/0352464 | A1 * | 12/2016 | Shen | H03M 13/13 |
| 2017/0163287 | A1 * | 6/2017 | Parthasarathy | H03M 13/1108 |
| 2017/0187396 | A1 * | 6/2017 | Jeong | H03M 13/1575 |

FOREIGN PATENT DOCUMENTS

| | | |
|---|---|---|
| CN | 102164025 A | 6/2011 |
| CN | 102122966 A | 7/2011 |
| CN | 102694625 A | 9/2012 |
| CN | 102739358 A | 10/2012 |

OTHER PUBLICATIONS

M. Seidl, A. Schenk, C. Stierstorfer and J. B. Huber, "Aspects of Polar-Coded Modulation," SCC 2013; 9th International ITG Conference on Systems, Communication and Coding, Munchen, Deutschland, 2013, pp. 1-6.*

"A Brief Introduction to Polar Codes" Supplemental Material for Advanced Channel Coding by Henry D. Pfister Apr. 21, 2014.*

E. Arikan, "Channel Polarization: A Method for Constructing Capacity-Achieving Codes for Symmetric Binary-Input Memoryless Channels," In IEEE Transactions on Information Theory, vol. 55, No. 7, pp. 3051-3073, Jul. 2009.*

"A Painless Guide to CRC Error Detection Algorithms"By Ross N. Williams Aug. 19, 1993 at ftp.adelaide.edu.au/pub/rocksoft/crc_v3.txt.*

Error Control Systems for Digital Comunication and Storage by Stephen B. Wicker 1995 by Prentice-Hall, Inc.*

Li el al., "Theory and Application of Polar Code," Communications Technology vol. 45, No. 10, pp. 21-24, (2012).

Cadambe et al., "Interference Alignment and Spatial Degrees of Freedom for the K User Interference Channel," IEEE International Conference on Communications, Institute of Electrical and Electronics Engineers, New York, New York (May 19-23, 2008).

3GPP TS 36.212 V8.1.0 (Nov. 2007),3rd Generation Partnership Project;Technical Specification Group Radio Access Network;Evolved Universal Terrestrial Radio Access (E-UTRA);Multiplexing and channel coding(Release 8),total 39 pages.

* cited by examiner

CHANNEL CODING METHOD AND DEVICE

CROSS-REFERENCE TO RELATED APPLICATIONS

This application is a continuation of International Patent Application No. PCT/CN2014/078741, filed on May 29, 2014 which claims priority to Chinese Patent Application No. 201310213255.1, filed on May 31, 2013, both of which are hereby incorporated by reference in their entireties.

TECHNICAL FIELD

Embodiments of the present invention relate to the field of communication and, in particular, to a coding method and a coding device.

BACKGROUND

A communication system generally uses channel coding to improve reliability of data transmission and ensure quality of communication. A polar (Polar) code is a theoretically-proved good code which may obtain a Shannon capacity and has low encoding and decoding complexities (the encoding and decoding complexities are O (N log N), where N is a code length). When a code length of the Polar code is large, good performance can be obtained by using successive-cancellation (Successive-Cancellation, SC) decoding, such as SC decoding and SC-List decoding, the SC-List decoding greatly improves performance of the SC decoding, which is close to the best maximum-likelihood decoding (maximum-likelihood, ML for short) performance. However, when the Polar code is short or is of a medium length, performance of the proposed SC decoding and SC-list decoding is not outstanding, and the performance needs to be improved. That is to say, the SC decoding can achieve good performance which approaches Shannon limit in a case where the code length N is very long; but when N is relative short or is of a medium length, the performance of the SC decoding of the Polar code does not exceed performance of a Turbo and a low density parity check code (Low Density Parity Check Code, LDPC code for short), thus the decoding performance needs to be further improved.

For this purpose, the industry insider has proposed an improved coding method for improving subsequent decoding performance, for instance, CRC coding and Polar coding are subject to cascade connection so as to improve minimum code distance of a final Polar code, thereby achieving an improvement in the performance of the SC decoding/SC-list decoding of the Polar code when the code length N is relatively short or is of a medium length. A matrix generated by the above-described CRC coding method has a following form: $G_{CRC}=[I\ P_{CRC}]$.

However, a Polar code generating method using the cascaded CRC coding may not be able to improve minimum distance of entire codes; for instance, the Polar code cannot improve the minimum code distance under the CRC check code with some generator polynomial.

SUMMARY

For this reason, embodiments of the present invention provide a coding method and a coding device, which are used to solve a problem in the prior art that minimum code distance of a Polar code is not large enough when the Polar code is relatively short or is of a medium length.

In a first aspect, embodiments of the present invention provide a coding method, including:
performing cyclic redundancy check CRC coding on a to-be-coded information bits, then inputting the CRC-coded bits into an interleaver determined by a construction parameter of a Polar code, where the interleaver is configured to interleave the CRC-coded bits and output interleaved bits; and
performing polar coding on the output interleaved bits to obtain a coded Polar code.

With reference to the first aspect, in a first possible implementation, the performing polar coding on the output interleaved bits includes:
performing polar coding on the interleaved bits output by the interleaver according to a set arranged by an information bit set of systematic Polar code.

With reference to the first aspect, in a second possible implementation, if the information bits to be coded are $K_1$, then the CRC-coded bits are $b_{[i]}$, where $i=1, \ldots, K$, $K=K_1+L$, and L is the number of cyclic redundancy check;
inputting K into the interleaver $u_{[A(i)]}=b_{[i]}$ to obtain an output $u_{[A(i)]}$, A is a set of information bit indexes; and
performing polar coding on $u_{[A(i)]}$ to obtain a coded Polar code;
where, A(i) is an index of an $i^{th}$ information bit, and is the construction parameter of the Polar code.

With reference to the first aspect and the second possible implementation, in a possible implementation, the performing polar coding on $u_{[A(i)]}$ includes:
coding $u_{[A(i)]}$ by using a systematic Polar code coding scheme; or,
coding $u_{[A(i)]}$ by using a non-systematic Polar code coding scheme.

In a second aspect, embodiments of the present invention also provide a coding device, including:
a CRC check module, configured to perform cyclic redundancy check CRC code on to-be-coded information bits;
an interleaver, configured to interleave the CRC-coded bits coded to obtain interleaved bits; and
a Polar code coding module, configured to perform polar coding on the interleaved bits to obtain a coded Polar code.

With reference to the second aspect, in a first possible implementation, the Polar code coding module is specifically configured to:
perform polar coding on the interleaved bits output by the interleaver according to a set arranged by an information bit set of systematic Polar code.

With reference to the second aspect, in a second possible implementation, the Polar code coding module is a systematic Polar code encoder or a non-systematic Polar code encoder.

With reference to the second aspect and possible implementations described above, in a third possible implementation, the interleaver is determined by a construction parameter using the Polar code.

It can be seen from the above technical solution that, in a coding method and a coding device according to embodiments of the present invention, the to-be-coded information bits are CRC coded, and then the CRC-coded bits are input into the interleaver so that the interleaver interleaves the CRC-coded bits, and the interleaved bits are polar coded to obtain the coded Polar code, thereby solving a problem in the prior art that minimum code distance of a Polar code is not large enough when the Polar code is relatively short or is of a medium length.

BRIEF DESCRIPTION OF DRAWINGS

In order to make technical solutions of the present invention clearer, accompanying drawings used for description of the embodiments will be briefly described hereunder. Obviously, the following drawings are merely the drawings of some embodiments of the present invention. For persons skilled in the art, other drawings which may realize the technical solutions of the present invention may also be obtained based on these drawings without any creative effort.

DESCRIPTION OF EMBODIMENTS

In order to make objectives, technical solutions, and advantages of the present invention clearer, the technical solutions of the present invention will be described clearly and completely hereinafter with reference to the accompanying drawings in embodiments of the present invention. Obviously, the described embodiments are only a part of embodiments of the present invention. Based on embodiments of the present invention described below, persons of ordinary skill in the art may obtain other embodiments that can solve technical problems of the present invention and achieve technical effects of the present invention by making an equivalent variation to some even all technical features without any creative efforts, whereas the embodiments through these variations do not depart from the scope disclosed by the present invention apparently.

In order to facilitate the understanding of the present invention, Polar coding will be described firstly.

A Polar code is a linear block code, of which a generated matrix is $G_N$, and of which a coding process is $x_1^N = u_1^N G_N$, where $x_1^N$ is an output bit after the coding, $u_1^N$ is an input bit before the coding, $G_N = B_N F^{\otimes n}$, and a code length $N=2^n$, $n \geq 0$.

$B_N$ is a transposed matrix, such as a bit reversal (bit reversal) matrix.

$F^{\otimes n}$ is Kronecker power (Kronecker power) of F, which is defined as $$F^{\otimes n} = F \otimes F^{\otimes(n-1)},$$

$$F = \begin{bmatrix} 1 & 0 \\ 1 & 1 \end{bmatrix}.$$

The Polar code may be expressed as $(N, K, A, u_{A^c})$ using a coset code, of which the coding process is $x_1^N = u_A G_N(A) \oplus u_{A^c} G_N(A^c)$, A is a set of information (information) bit indexes herein, $G_N(A)$ is a submatrix obtained by those lines corresponding to indexes in the set A in $G_N$. $G_N(A^c)$ is a submatrix obtained by those lines corresponding to indexes in the set $A^c$ in $G_N$.

$u_{A^c}$ is a frozen (frozen) bit, of which the number is (N−K), being known bits, where, N is a code length, and x is a length of an information bit. For the sake of simplicity, these frozen bits may be set to 0, at this time, the above coding process is simplified as $x_1^N = u_A G_N(A)$.

In order to increase minimum code distance of the Polar code, embodiments of the present invention provide a new coding method. The coding method in embodiments of the present invention introduces an interleaver in relation to a construction parameter of the Polar coding, for increasing minimum distance of a Polar code obtained finally.

Figure 1:
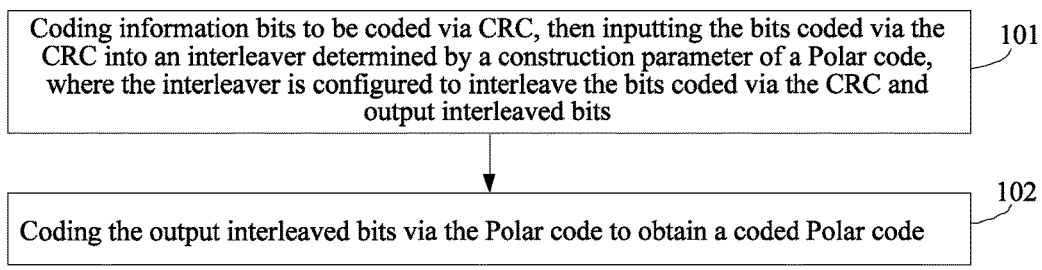
FIG. 1 is a schematic flow chart of a coding method according to an embodiment of the present invention.

FIG. 1 shows a schematic flow chart of a coding method according to an embodiment of the present invention, as shown in FIG. 1, the coding method in this embodiment is described as below.

101, performing CRC coding on to-be-coded information bits, then inputting the CRC-coded bits into an interleaver determined by a construction parameter of a Polar code, where the interleaver is configured to interleave the CRC-coded bits and output interleaved bits.

In this embodiment, the interleaver is configured to increase a minimum code distance of a Polar code obtained finally.

102, performing polar coding on the output interleaved bits to obtain a coded Polar code.

In the coding method in the above embodiment, the to-be-coded information bits are CRC coded, and then the CRC-coded bits are input into the interleaver so that the interleaver interleaves the CRC-coded bits, and the interleaved bits are polar coded to obtain the coded Polar code, thereby solving a problem in the prior art that minimum code distance of a Polar code is not large enough when the Polar code is relatively short or is of a medium length.

In an alternative embodiment, the "performing polar coding on the output interleaved bits" in the step 102 described above includes a step 1021 not shown in the figures:

1021, performing polar coding, according to a set arranged by an information bit set of systematic Polar code, the interleaved bits output by the interleaver.

Figure 2:
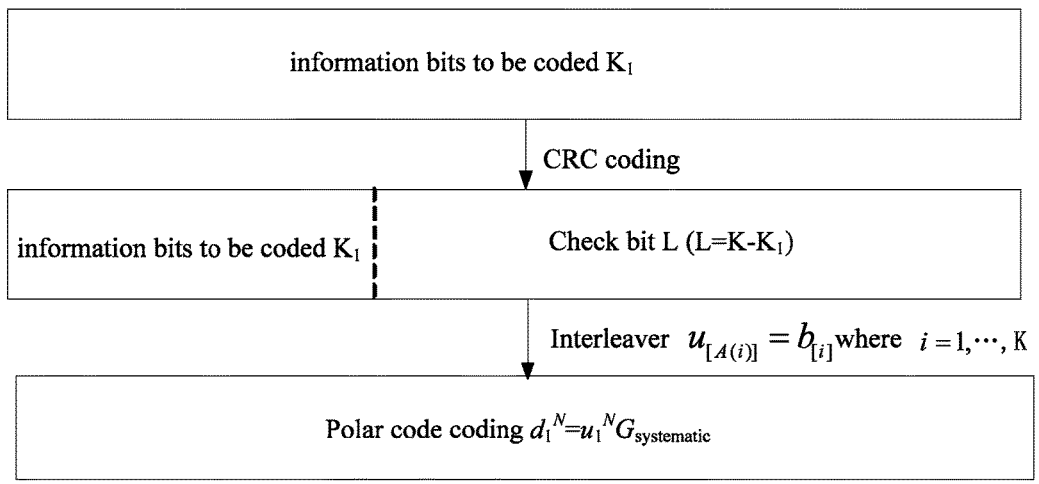
FIG. 2 is a schematic flow chart of a coding method according to an embodiment of the present invention.

In another alternative embodiment, reference may be made to FIG. 2, the coding method in this embodiment includes:

S01, if the information bits to be coded are $K_1$, then the CRC-coded bits coded are $b_{[i]}$, where i=1, . . . , K, K=$K_1$+L, and L is the number of cyclic redundancy check;

S02, inputting K into the interleaver $u_{[A(i)]} = b_{[i]}$ to obtain an output $u_{[A(i)]}$, A is a set of information bit indexes.

Generally, the set of A is ordered according to reliability of information bits from high to low. As it can be seen above, bits sequence after CRC (the check bits are subsequent to the system bits) maps to the polar code's information bits set according to the reliability (such as a Polar system code).

S03, performing polar coding on $u_{[A(i)]}$ to obtain a coded Polar code;

where, A(i) is an index of an $i^{th}$ information bit, and is the construction parameter of the Polar code.

For instance, the performing polar coding on $u_{[A(i)]}$ may include: coding $u_{[A(i)]}$ by using a systematic Polar code coding scheme; or, performing coding $u_{[A(i)]}$ by using a non-systematic Polar code coding scheme.

Furthermore, decoding for a CRC-cascaded Polar code corresponding to the coding method as shown in FIG. 1 or FIG. 2 may be as follow:

an inverse interleaving module may be introduced into the SC List decoding and the CRC check, then the decoding for the CRC-cascaded Polar code that is proposed in this embodiment may be implemented.

The coding method in the above embodiments may effectively solve a problem in the prior art that, minimum code distance of a Polar code is not large enough when the Polar code is relatively short or is of a medium length, and its performance is not sufficient enough to compete with performance of a Turbo code.

Figure 3:
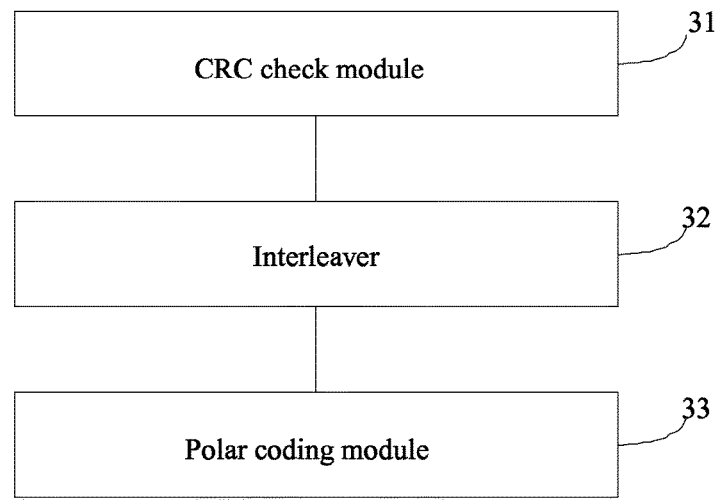
FIG. 3 is a schematic structural diagram of a coding device according to an embodiment of the present invention.

FIG. 3 is a schematic structural diagram of a coding device according to an embodiment of the present invention, as shown in FIG. 3, the coding device in this embodiment includes: a CRC check module 31, an interleaver 32 and a Polar code coding module 33;

where, the CRC check module 31 is configured to perform CRC coding on to-be-coded information bits;

the interleaver 32 is configured to interleave the CRC-coded bits to obtain interleaved bits; and the Polar code coding module 33 is configured to perform polar coding on the interleaved bits to obtain a coded Polar code.

In an alternative embodiment, the above-described Polar code coding module 33 is specifically configured to:

perform polar coding on the interleaved bits output by the interleaver according to a set arranged by an information bit set of systematic Polar code.

During a specific application process, the Polar code coding module is a systematic Polar code encoder or a non-systematic Polar code encoder.

In particular, the interleaver 32 in this embodiment may be determined by a construction parameter using the Polar code.

The coding device in the above embodiments may effectively solve a problem in the prior art that, minimum code distance of a Polar code is not great enough when the Polar code is relatively short or is of a medium length, and its performance is not sufficient enough to compete with performance of a Turbo code.

A coding method for improving minimum code distance of the entire code by introducing an interleaver between a CRC check module and a Polar code coding module, will be described hereunder through simulated data and relevant contents.

In the simulation, we use 16 bits and 24 bits of CRC generator polynomial of an ITU as follows:

$g_{CRC24}(D) = [D^{24} + D^{23} + D^6 + D^5 + D + 1]$ for a CRC length $L=24$ $g_{CRC16}(D) = [D^{16} + D^{12} + D^5 + 1]$ for a CRC length $L=16$.

In the simulation experiment, the minimum code distance of the entire Polar code is calculated using Anne Canteaut' algorithm.

It should be noted that, Anne Canteaut' described above is an algorithm disclosed in the prior art, which is only applied in the simulation experiment in this embodiment.

Compared with the method in the prior art, the minimum code distances obtained through calculation are shown in Table 1 as below:

TABLE 1

|  | Systematic Polar code (2048, 683) +24CRC | Systematic Polar code (2048, 683) +16CRC | Systematic Polar code (2048, 1024) +24CRC | Systematic Polar code (2048, 1024) +16CRC |
| --- | --- | --- | --- | --- |
| Coding method in the prior art where CRC coding is cascaded to Polar coding | Minimum code distance: 64 | Minimum code distance: 32 | Minimum code distance: 32 | Minimum code distance: 24 |
| Coding method as shown in FIG. 1 or FIG. 2 in this embodiment | Minimum code distance: 80 | Minimum code distance: 64 | Minimum code distance: 32 | Minimum code distance: 32 |

TABLE 1-continued

|  | Systematic Polar code (2048, 683) +24CRC | Systematic Polar code (2048, 683) +16CRC | Systematic Polar code (2048, 1024) +24CRC | Systematic Polar code (2048, 1024) +16CRC |
| --- | --- | --- | --- | --- |

The systematic Polar code (2048, 683) in the above table represents a systematic Polar code of which a code length $N=2048$ and an information bit length $K=683$.

Figure 4:
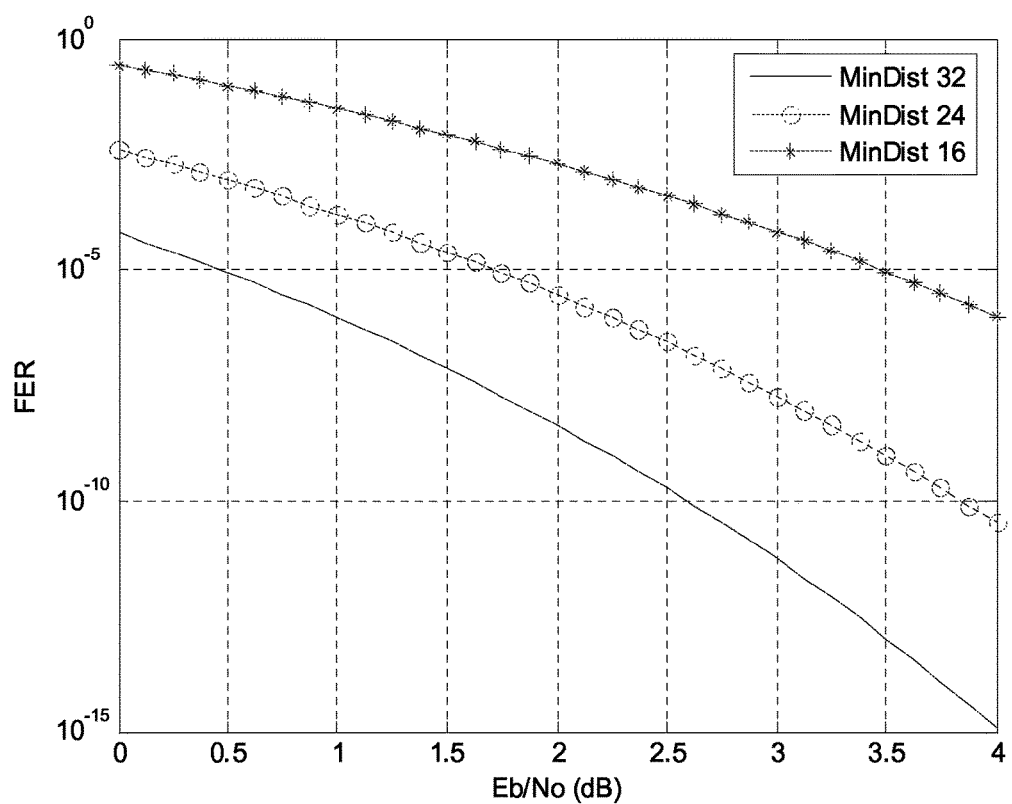
FIG. 4 is a simulation diagram of minimum code distance of various coding methods.

FIG. 4 shows a simulation diagram of minimum code distance of various coding methods, as shown in FIG. 4, FIG. 4 is a union Bound of frame error rates (Frame Error Rate, FER) of various minimum code distance obtained by utilizing a first-order approximation $$FER \simeq \frac{1}{2} n(d_{min}) \mathrm{erfc}\left(\left(d_{min} R \frac{Eb}{N0}\right)^{1/2}\right)$$

of the union bound. As shown in FIG. 4, if maximum-likelihood decoding ML is used, the FER will be greatly improved when minimum code distance is increased from 24 to 32.

The above simulation experiment has proved that, the coding method in embodiments of the present invention may effectively solve a problem in the prior art that, minimum code distance of a Polar code is not great enough when the Polar code is relatively short or is of a medium length, and its performance is not sufficient enough to compete with performance of a Turbo code.

Persons of ordinary skill in the art may understand that, all or a part of steps of the foregoing method embodiments may be implemented by a program instructing relevant hardware. The foregoing program may be stored in a computer readable storage medium. When the program runs, the steps of the foregoing method embodiments are performed. The foregoing storage medium includes various mediums capable of storing program codes, such as a ROM, a RAM, a magnetic disk, or an optical disc.

Finally, it should be noted that: the foregoing embodiments are merely intended for describing the technical solutions of the present invention rather than limiting the present invention. Although the present invention is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make essence of corresponding technical solutions depart from the scope of the technical solutions in the embodiments of the present invention.

What is claimed is:

1. A method for transmitting data by a communication device, comprising:

obtaining, by the communication device, $K_1$ bits, wherein $K_1$ is a integer greater or equal to 1;

performing, by the communication device, cyclic redundancy check (CRC) coding on the $K_1$ bits to obtain K CRC-coded bits, wherein K is a integer greater or equal to $K_1$;

interleaving, by the communication device, the K CRC-coded bits based on an interleaver in relation to a bit length of a polar coding process to obtain K interleaved bits; and performing, by the communication device, polar coding on the K interleaved bits according to the polar coding process of $x_1^N = u_1^N G_N$, wherein $x_1^N$ is an N-bit encoded sequence output by the polar coding process, $u_1^N$ is an N bits obtained from the K interleaved bits, the bit length is the length of the K interleaved bits and equal to K, $G_N$ is a Polar code generating matrix of N rows×N columns, the $j^{th}$ row of the N×N matrix corresponds to the $j^{th}$ bit of $u_1^N$, j=1, 2, . . . , N;

transmitting, by the communication device, the encoded sequence $x_1^N$.

2. The method according to claim 1, wherein $K=K_1+L$, and L is a quantity of cyclic redundancy check bits, and L=24.

3. The method according to claim 1, wherein the K CRC-coded bits are interleaved based on $u_{[A(i)]} = b_{[i]}$ to obtain an output $u_{[A(i)]}$ from an input $b_{[i]}$, wherein A is a set of interleaved bit indexes, A(i) is an index of an $i^{th}$ interleaved bit, wherein i=1, . . . , K.

4. The method according to claim 1, wherein the interleaver is in relation to indexes of bits input into the polar coding process.

5. A communication device, comprising:
a cyclic redundancy check (CRC) encoder;
an interleaver coupled to the CRC encoder;
a polar code encoder coupled to the interleaver; and
a transmitter coupled to the polar code encoder; wherein:
the CRC encoder is configured to obtain $K_1$ bits and perform CRC coding on the $K_1$ bits to obtain K CRC-coded bits, wherein $K_1$ is a integer greater or equal to 1, wherein K is a integer greater or equal to $K_1$;
the interleaver is configured to interleave the K CRC-coded bits to obtain K interleaved bits, and the interleaver is in relation to a bit length of a polar coding process; and
the polar code encoder is configured to perform polar coding on the K interleaved bits according to a polar coding process of $x_1^N = u_1^N G_N$, wherein $x_1^N$ is an N-bit encoded sequence output by the polar coding process, $u_1^N$ is an N bits obtained from the K interleaved bits, the bit length is the length of the K interleaved bits and equal to K, $G_N$ is a Polar code generating matrix of N rows×N columns, the $j^{th}$ row of the N×N matrix corresponds to the $j^{th}$ bit of $u_1^N$, j=1, 2, . . . , N; and
the transmitter is configured to transmit the encoded sequence $x_1^N$.

6. The device according to claim 5, wherein K equals to the bit length and $K=K_1+L$, and L is a quantity of cyclic redundancy check bits, and L=24.

7. The method according to claim 5, wherein the K CRC-coded bits are interleaved based on $u_{[A(i)]} = b_{[i]}$ to obtain an output $u_{[A(i)]}$ from an input $b_{[i]}$, wherein A is a set of interleaved bit indexes, A(i) is an index of an $i^{th}$ interleaved bit, wherein i=1, . . . , K.

8. The method according to claim 5, wherein the interleaver is in relation to indexes of bits input into the polar coding process.

\* \* \* \* \*